United States Patent [19]

Haken et al.

[11] Patent Number: 5,021,851
[45] Date of Patent: Jun. 4, 1991

[54] NMOS SOURCE/DRAIN DOPING WITH BOTH P AND AS

[75] Inventors: Roger A. Haken, Richardson; David B. Scott, Plano, both of Tex.

[73] Assignee: Texas Instruments Incorporated, Dallas, Tex.

[21] Appl. No.: 453,097

[22] Filed: Dec. 13, 1989

Related U.S. Application Data

[63] Continuation of Ser. No. 191,849, May 3, 1988, abandoned, which is a continuation of Ser. No. 718,818, Apr. 1, 1985, abandoned, which is a continuation of Ser. No. 344,589, Feb. 1, 1982, abandoned.

[51] Int. Cl.$^5$ .................. H01L 29/78; H01L 27/02; H01L 21/265
[52] U.S. Cl. .................. 357/23.9; 357/23.8; 357/42; 357/90; 437/30
[58] Field of Search .............. 357/23.4, 23.9, 23.12, 357/23.8, 23.1, 90

[56] References Cited

U.S. PATENT DOCUMENTS

| 4,089,712 | 5/1978 | Joy et al. ...................... 357/23 D |
| 4,092,661 | 5/1978 | Watrous ......................... 357/90 |
| 4,291,321 | 9/1981 | Pfleiderer et al. ............. 357/23 S |
| 4,342,149 | 8/1982 | Jacobs et al. ................. 357/23 VD |
| 4,369,072 | 1/1983 | Bakeman et al. ............... 357/91 |

OTHER PUBLICATIONS

Ohta et al. "Quadruply Self-Aligned MOS (OSA MOS-)—A New Short-Channel High-Speed High-Density MOSFET for ULSI", IEEE Trans. Electron. Devices, vol. ED-27 Aug. 1980 pp. 1352-1358.

Sunami et al. "Characteristics of a Buried Channel, Graded Drain with Punch-Through stopper (BGP) MOS Device", 1981 Symposium on VLSI Technology, Hawaii Sept. 1981, Dig. Tech. Papers, pp. 20-21.

Takeda et al. "Submicron MOSFET Structure for Minimizing Channel Hot-Electron Injection", 1981 Symposium on VLSI Technology, Hawaii Sept. 1981, Dig. Tech. Papers, pp. 22-23.

Primary Examiner—Gene M. Munson
Attorney, Agent, or Firm—James C. Kesterson; James T. Comfort; Melvin Sharp

[57] ABSTRACT

A process for forming N-channel MOS sources and drains, by implanting both phosphorus and arsenic. The high diffusivity of phosphorus causes it to diffuse in advance of the bulk of the arsenic, so that, after annealing, the source/drain regions have graded regions of gradually decreasing conductivity adjacent to the end of the channels. Thus the electric potential gradient at the ends of the channels is reduced, and impact ionization and hot carrier effects are avoided. The effective radius of the source (or drain) junction is increased, providing increased breakdown voltage.

11 Claims, 1 Drawing Sheet

NMOS SOURCE/DRAIN DOPING WITH BOTH P AND AS

This application is a continuation of application Ser. No. 191,849, filed May 3, 1988, now abandoned, which is a continuation of Ser. No. 718,818, filed Apr. 1, 1985, now abandoned, which is a continuation of Ser. No. 344,589, filed Feb. 1, 1982, now abandoned. Applicants' copending divisional application Ser. No. 169,164 filed Mar. 9, 1988, discloses related subject matter.

BACKGROUND OF THE INVENTION

The present invention relates to a method for forming MOS transistors, and to transistors formed by this method.

A difficulty in the fabrication of small-geometry MOS devices is the following quandary: If the source/drains are doped to a level high enough to give reasonably low series resistance, the magnitude of the electric field in the channel adjacent to the drain during the on-state will be tremendous, and hot carriers and impact ionization effects will become a nuisance.

As the MOSFET channel becomes shorter, the electric field along the channel becomes more important. That is, the potential distribution becomes two dimensional, and the effect of the electric field along the channel can no longer be ignored while considering the effects of the electric field normal to the channel. In particular, where the electric field along the channel is high, as it is likely to be in short-channel MOS devices, impact ionization is likely to occur near the drain. The resulting substrate current greatly increases the likelihood of latch-up. In addition, hot carriers are also likely to be generated by the strong electric field magnitude near the drain, and some of these carriers may be injected into the oxide, leading to threshold shift.

Thus, it is an object of the present invention to reduce the magnitude of electric field seen along the channel near the drain of an MOS device.

A difficulty in fabricating MOS devices with reasonably shallow source/drain diffusions is that the sharp curvature of the junction will cause a locally increased electric field, and therefore a reduced breakdown voltage. This causes great difficulty when high-voltage devices with reasonably small geometry are desired. If an arsenic implanted drain junction is to have a reasonable curvature, a very long drive-in time is required, causing undesired thermal effects in the other parts of the device.

Thus, it is a further object of the present invention to provide a method for forming source/drain regions having low series resistance and a large junction radius.

It is a further object of the present invention to provide a method for forming source/drain regions having a low contact resistance and a large junction radius.

It is a further object of the present invention to provide a process, satisfying the above-stated objects, which does not require additional masking or heating steps.

SUMMARY OF THE INVENTION

Both arsenic and phosphorus are implanted to form the drain of an N-channel transistor. Preferably the phosphorus is implanted in a dose no larger than the arsenic. Since the two implants are identically masked, the greater diffusivity of the phosphorus means that it will diffuse laterally in advance of the arsenic during annealing of the implant. Thus, the arsenic provides low contact resistance, while the phosphorus provides reasonably gentle junction curvature. Moreover, a region of graduated doping will exist at the boundary between the drain and channel, so that the potential distribution in this area is smoothed out, and the peak electric field magnitude is reduced. Thus, the effects caused by highly-accelerated carriers are reduced. Not only is impact ionization and hot carrier generation reduced, but other short-channel effects, such as loss of current saturation effects, variable threshold voltage, and degradation of subthreshold behavior, are reduced.

According to the present invention there is provided a method for forming MIS source/drain regions, comprising the steps of:
 providing a semiconductor substrate;
 masking said substrate except where said source/drain regions are to be implanted;
 implanting dopant atoms of first and second species in said respective source/drain regions, both said dopant species having the same conductivity type in said substrate, and said first species having a higher diffusivity than said second species; and
 annealing said implanted dopants;
 whereby said implanted first species diffuses beyond said implanted second species during said annealing step.

BRIEF DESCRIPTION OF THE DRAWINGS

The present invention will be described with reference to the accompanying drawings, wherein.

DESCRIPTION OF THE PREFERRED EMBODIMENTS

The present invention applies to the formation of source/drain regions in MIS devices. It is of particular importance in optimizing the characteristics of the drain region. The presently preferred embodiment is in the fabrication of NMOS devices within a CMOS structure.

Figure 1:
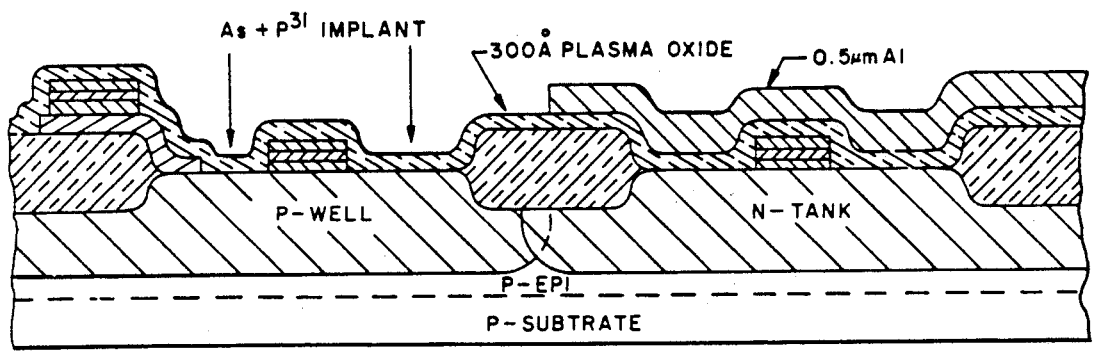
FIG. 1 shows ion implantation of the source/drain regions in an N-channel device, during CMOS processing.
Figure 2:
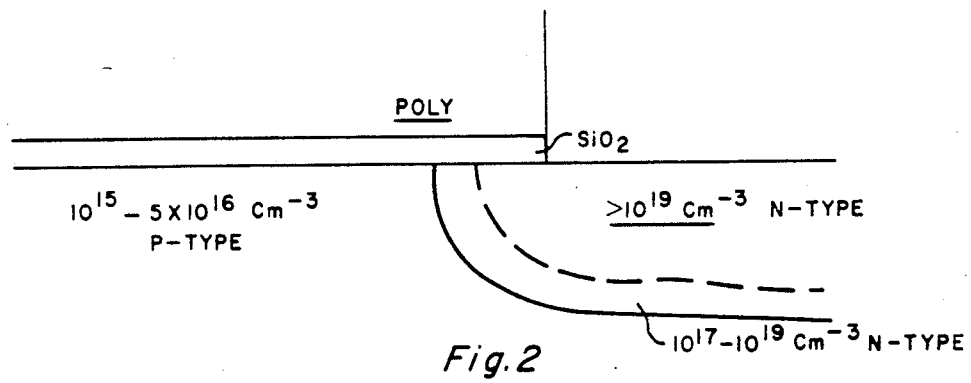
FIG. 2 shows schematically the dopant distribution in an NMOS drain region, after annealing of a double implant.

FIG. 1 shows implantation of N-type source/drains within CMOS processing. In the present invention, both phosphorus and arsenic are implanted at this step. Moreover, the implant energies are preferably selected so that the depth profiles of concentration as implanted are approximately the same for the two impurities. Thus, for example, implant energies of 120 keV for arsenic and keV for phosphorus 31 would give similar as-implanted profiles for the two impurities. After annealing, the implanted phosphorus will have diffused slightly in advance of the implanted arsenic, so that, behind the drain/channel junction, a gradation in conductivity will exist, as shown in FIG. 2.

Figure 3:
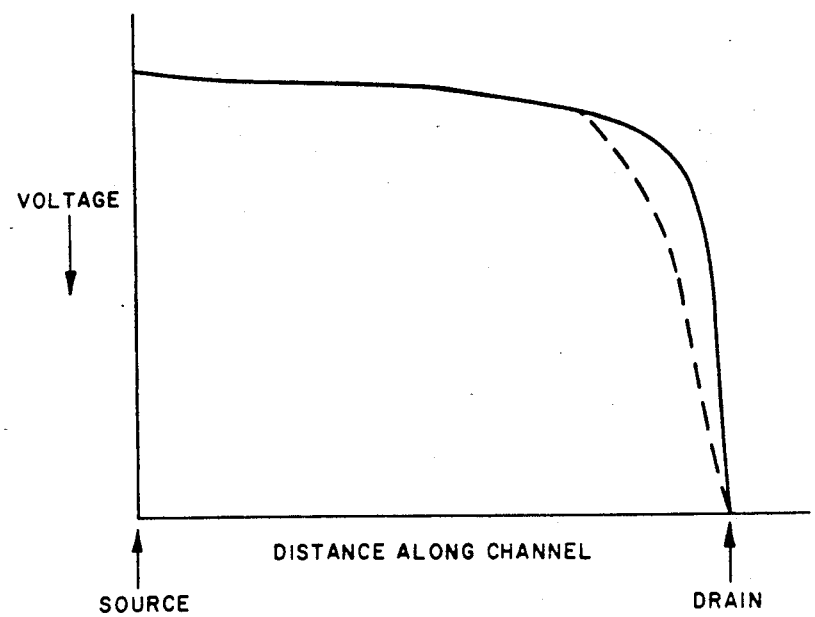
FIG. 3 shows approximately the electric potential distribution along the channel of an NMOS device with double-implanted source/drains according to the present invention.

The effect of this is shown in FIG. 3. The dashed line at FIG. 3 schematically shows sample on-state electric potential profiles along the channel, where source/drain regions have been formed according to the present invention. The solid line of FIG. 3 schematically shows the potential distribution which would exist under the same conditions of gate, source, and drain voltage, where the device geometry is the same except that the sources and drains are of uniform conductivity. As may easily be seen from this figure, the effect of the present invention is to greatly reduce the gradient of the electric potential near the drain, and therefore to greatly reduce the peak electric field.

It will be obvious to those skilled in the art that the present invention may be applied in a wide variety of processes and contexts. In particular, it is applicable to formation of N-channel devices in either CMOS or NMOS technology.

Moreover, the present invention can also be applied to other combinations of dopants. The key requirement is that two dopants of the same type, having different diffusivities, be used; for example, boron and gallium can be used to form P-channel devices, as can boron and indium.

A sample application of the present invention implants $1 \times 10^{16}$ cm$^{-2}$ of arsenic at 120 keV, and $2 \times 10^{15}$ cm$^{-2}$ of phosphorus at 50 keV, into the regions exposed by the N-type source/drain mask, during CMOS processing. A single annealing step follows. Further background on integrated circuit processing is found in, e.g., A. Glaser & G. Subak-Sharpe, Integrated Circuit Engineering, which is hereby incorporated by reference.

The anneal is performed with parameters well known in the art. For example: 50 nm of plasma-assisted CVD oxide is first deposited. The oxide is densified at 700° C., with 10 minutes in $O_2$, 30 minutes in steam, and 10 minutes in argon. The temperature is then raised to 1000° C. in Ar, and held at 1000° C. for 20 minutes. The temperature is then lowered to 800° C., and held there for 30 minutes, still in argon. Next 650 nm of phosphosilicate glass (PSG) is deposited, and the PSG is reflowed at 975° C., POCl$_3$ doping, and 3 minutes in $O_2+N_2$ again. These annealing times represent only one choice within a broad range of parameters, and longer times at lower temperatures, or higher temperatures at lower times, may also be used. In addition, the annealing time at a given temperature may also be increased (or decreased), in which case the diffusion length of the phosphorus implant beyond the arsenic implant will also increase (or decrease). The oxide and PSG deposition steps are detailed here because the high-temperature PSG reflow further contributes to annealing the source/drain implants. However, the implant annealing (drive-in) is affected only by time and temperature, and not by the surface depositions. This annealing process results in about a 0.3 micron band at the edge of the source/drain region where the phosphorus has diffused beyond the arsenic. Thus, a source/drain formed by the inventive double-implant process has 1) a central core having a high concentration of both arsenic and phosphorus, surrounded by 2) a peripheral band, within the junction at the sides of the source/drain region, where the total dopant concentration is much lower, and is largely composed of phosphorus.

The maximum thickness of the peripheral band is determined merely by the desired size of the source/drain junction boundary. (Excessive drive-in time will shorten channel length, may infringe the lateral spacings which avert latch-up, or may conduce to punch-through in the P-well technology.) There is no specific minimum thickness for the peripheral band, but the advantages of the invention are less well obtained with shorter drive-in time. However, the thickness of the peripheral band is preferably at least one-tenth of the source/drain junction depth.

What we claim is:
1. A MIS transistor comprising:
a semiconductor layer of a first conductivity type;
first and second source/drain regions of an opposite conductivity type each comprising a junction within said layer, said first and second source/drain regions defining a channel region therebetween;
a gate dielectric on said channel; and
a gate on said gate dielectric;
wherein said first source/drain region comprises a core region and a peripheral band, said peripheral band being interposed between said core region and said channel region, said core region including a common portion implanted with two dopant species of the same conductivity type and another portion diffused outwardly from said common portion and having a curved shape defined by the simultaneous diffusion of said two dopants, and said peripheral band including a significant concentration of only one of said two dopant species, said only one dopant consisting essentially of dopant diffused from said core region and said peripheral band having a curved shape defined by the diffusion of said only one dopant during said simultaneous diffusion and which diffusivity is greater than that of said other dopant.

2. The transistor of claim 1,
wherein said semiconductor layer is silicon,
and wherein said core region of said first source/drain region contains arsenic and phosphorus, and said peripheral band contains phosphorus.

3. The transistor of claim 1, wherein the maximum thickness of said peripheral band is at least one-tenth of the maximum depth of said first source/drain region.

4. The transistor of claim 1, wherein said semiconductor layer is silicon,
and wherein said two dopant species are boron and gallium.

5. The transistor of claim 1, wherein said semiconductor layer is silicon,
and wherein said two dopant species are boron and indium.

6. A field effect transistor drain comprising:
(a) a semiconductor substrate doped a first conductivity type and having a structure formed thereon;
(b) a first region in said substrate heavily doped a second conductivity type with two dopants having different diffusion characteristics, said heavily doped first region including a common area defined by the implantation of said two dopants and an area of simultaneous diffusion of said two dopants extending away from said implantation area and under said structure said diffusion area having a curved shape defined by said simultaneous diffusion; and
(c) a second region in said substrate lightly doped as a second conductivity type by the greater diffusion of a single one of said two dopants, said dopant in said second region consisting essentially of said single dopant diffused from said first region during said simultaneous diffusion, said second region defining a peripheral band between said semiconductor substrate and said area of simultaneous diffusion in said first region and having a curved shape defined by said greater diffusion of said only one dopant.

7. The transistor drain of claim 6 wherein the outward edge of said implantation portion is aligned with an edge of said structure.

8. The transistor drain of claim 6 wherein the depth of implantation in said first region is to approximately the same depth.

9. An insulated gate filed effect transistor, comprising:
   (a) a substrate containing source, drain, and channel regions at a surface, said channel region of a first conductivity type and said source and drain regions of opposite conductivity type;
   (b) a gate insulator on said surface and covering at least said channel;
   (c) a gate on said gate insulator and with sidewalls substantially perpendicular to said surface at said insulator;
   (d) said drain region comprising a core region and a surrounding peripheral region, said core region heavily doped by a combination of two implanted dopants of different diffusivities and comprising an area of implantation aligned with an edge of said gate and an area of simultaneous diffusion of both of said implanted dopants extending away from said implantation area and under said gate and with a curved shape defined by said simultaneous diffusion, said peripheral region comprising a lightly doped diffusion band between said substrate and said diffusion area of said core region, the dopant in said lightly doped diffusion band consisting essentially of the greater diffusion of a single one of said two dopants implanted in said core region and said peripheral region having a curved shape defined by the greater diffusion of said single one dopant.

10. The transistor of claim 9, wherein:
   (a) said substrate is silicon;
   (b) said core region is doped with arsenic and phosphorus; and
   (c) said peripheral region is doped with phosphorus.

11. A field effect transistor drain comprising:
   (a) a semiconductor substrate doped a first conductivity type and having a structure formed thereon;
   (b) a first region in said substrate heavily doped a second conductivity type by implantation of two dopants to approximately the same depth and having different diffusion characteristics said heavily doped first region including an implementation area defined by said implantation of said two dopants and with an edge aligned with an edge of said structure and an area of diffusion of said two dopants extending away from said implantation area and under said structures, said area of diffusion having a curvature defined by said diffusion of said two dopants; and
   (c) a second region in said substrate lightly doped as a second conductivity type, said dopant in said second region consisting essentially of the greater diffusion of a single one of said two dopants from said first region, said second region defining a peripheral band between said semiconductor substrate and said diffusion area of said first region and having a curved shape defined by the diffusion of said single dopant.

* * * * *